US009214468B2

(12) United States Patent
Kim

(10) Patent No.: US 9,214,468 B2
(45) Date of Patent: Dec. 15, 2015

(54) SEMICONDUCTOR DEVICE AND METHOD FOR FABRICATING THE SAME

(75) Inventor: Seung Hwan Kim, Seoul (KR)

(73) Assignee: HYNIX SEMICONDUCTOR INC., Incheon (KR)

( * ) Notice: Subject to any disclaimer, the term of this patent is extended or adjusted under 35 U.S.C. 154(b) by 327 days.

(21) Appl. No.: 13/447,034

(22) Filed: Apr. 13, 2012

(65) Prior Publication Data

US 2013/0105875 A1 May 2, 2013

(30) Foreign Application Priority Data

Oct. 31, 2011 (KR) ........................ 10-2011-0112418

(51) Int. Cl.
| | | |
|---|---|---|
| H01L 21/28 | (2006.01) |
| H01L 27/108 | (2006.01) |
| H01L 29/417 | (2006.01) |
| H01L 29/45 | (2006.01) |
| H01L 29/66 | (2006.01) |
| H01L 29/78 | (2006.01) |

(52) U.S. Cl.
CPC .... *H01L 27/10876* (2013.01); *H01L 27/10823* (2013.01); *H01L 27/10885* (2013.01); *H01L 29/41741* (2013.01); *H01L 29/456* (2013.01); *H01L 29/66666* (2013.01); *H01L 29/7827* (2013.01)

(58) Field of Classification Search
CPC .............................. H01L 21/28; H01L 27/108
USPC .......................................................... 257/306
See application file for complete search history.

(56) References Cited

U.S. PATENT DOCUMENTS

| | | | | |
|---|---|---|---|---|
| 6,074,960 | A * | 6/2000 | Lee et al. ........................ | 438/749 |
| 7,713,823 | B2 * | 5/2010 | Sung et al. ..................... | 438/272 |
| 8,207,032 | B2 * | 6/2012 | Fischer et al. ................ | 438/242 |
| 8,309,416 | B2 * | 11/2012 | Park et al. ..................... | 438/253 |
| 8,338,873 | B2 * | 12/2012 | Son et al. ....................... | 257/302 |
| 8,507,374 | B2 * | 8/2013 | Kim ................ | 438/591 |
| 8,552,472 | B2 * | 10/2013 | Kim et al. ..................... | 257/242 |
| 9,076,864 | B2 * | 7/2015 | Lee et al. ............... | 1/1 |
| 2006/0113587 | A1 * | 6/2006 | Thies et al. ................... | 257/328 |
| 2007/0210374 | A1 * | 9/2007 | Wu ............................. | 257/329 |
| 2007/0228437 | A1 | 10/2007 | Forbes | |
| 2009/0159964 | A1 * | 6/2009 | Lee ............................. | 257/329 |
| 2009/0242971 | A1 * | 10/2009 | Cho et al. ..................... | 257/328 |
| 2009/0317954 | A1 * | 12/2009 | Kim ................ | 438/268 |
| 2010/0013005 | A1 * | 1/2010 | Roesner et al. ............... | 257/329 |
| 2010/0148233 | A1 * | 6/2010 | Fujimoto ..................... | 257/296 |
| 2010/0159663 | A1 * | 6/2010 | Kim et al. ..................... | 438/302 |

(Continued)

OTHER PUBLICATIONS

U.S. Appl. No. 13/326,280, filed Dec. 14, 2011, Min Chul Sung.

(Continued)

*Primary Examiner* — Jarrett Stark
*Assistant Examiner* — Charles N Ausar-El

(57) ABSTRACT

A semiconductor device and a method for fabricating the same are provided to enable a bit line to be formed easily, increase a bit line process margin and reduce capacitance between the adjacent bit lines. The semiconductor device comprises: a first pillar and a second pillar each extended vertically from a semiconductor substrate and including a vertical channel region; a first bit line located in the lower portion of the vertical channel region inside the first pillar and the second pillar; and an interlayer insulating film located between the first pillar and the second pillar that include the first bit line.

20 Claims, 6 Drawing Sheets

(56) References Cited

U.S. PATENT DOCUMENTS

| | | | | |
|---|---|---|---|---|
| 2010/0301407 A1* | 12/2010 | Sung | ................................ | 257/329 |
| 2011/0024811 A1* | 2/2011 | Kim | ................................ | 257/296 |
| 2011/0024815 A1* | 2/2011 | Kim | ................................ | 257/302 |
| 2011/0108985 A1* | 5/2011 | Kim | ................................ | 257/751 |
| 2011/0129974 A1* | 6/2011 | Eun et al. | ................................ | 438/268 |
| 2011/0260238 A1* | 10/2011 | Kim | ................................ | 257/330 |
| 2011/0304028 A1* | 12/2011 | Kim | ................................ | 257/623 |
| 2012/0135586 A1* | 5/2012 | Kim | ................................ | 438/513 |
| 2012/0153365 A1* | 6/2012 | Sung | ................................ | 257/288 |
| 2012/0217570 A1* | 8/2012 | Kim | ................................ | 257/324 |
| 2012/0286351 A1* | 11/2012 | Kim | ................................ | 257/329 |
| 2013/0049085 A1* | 2/2013 | Lin | ................................ | 257/296 |

OTHER PUBLICATIONS

Taiwanese Office Action for Application No. 101112204, dated Oct. 13, 2015.

* cited by examiner

SEMICONDUCTOR DEVICE AND METHOD FOR FABRICATING THE SAME

CROSS-REFERENCE TO RELATED APPLICATION

The present application claims priority to Korean patent application No. 10-2011-0112418 filed on Oct. 31, 2011, which is incorporated by reference in its entirety.

BACKGROUND OF THE INVENTION

1. Technical Field

The inventive concept relates generally to a semiconductor device and a method for fabricating the same, and more particularly to a semiconductor device that comprises a vertical channel transistor and a method for fabricating the same.

2. Related Art

In general, a semiconductor, as a material which belongs in an intermediate range between a conductor and a nonconductor by material classification depending on electric conductivity, has similar properties as a pure nonconductor, but its electric conductivity may be increased by the addition of impurities or by other manipulations. A semiconductor material is used for generating a semiconductor device such as a transistor by adding impurities and connecting device components. A semiconductor apparatus refers to an apparatus manufactured using such a semiconductor device with various functions. A representative example of a semiconductor apparatus is a semiconductor memory apparatus.

A semiconductor memory apparatus comprises a plurality of unit cells including a capacitor and a transistor. The capacitor is used to store data and the transistor is used to transfer data between the capacitor and a bit line in response to a control signal (a word line) using a semiconductor property in which electric conductivity changes according to conditions. The transistor has three parts including a gate, a source, and a drain. Electric charges move between the source and drain according to the control signal input to the gate. The electric charges move between the source and drain through a channel region using semiconductor properties.

When a conventional transistor is fabricated on a semiconductor substrate, the gate is formed over the semiconductor substrate and then the source and drain are formed by implanting impurities into the semiconductor substrate. In this case, a space between the source and the drain below the gate is a channel region of the transistor. Such a transistor having the vertical channel region occupies a given area of the semiconductor substrate. In a complicated semiconductor memory apparatus, it is difficult to reduce the whole area by a plurality of transistors included in the semiconductor memory apparatus.

If the whole area of the semiconductor memory apparatus is reduced, the number of semiconductor memory apparatuses that can be produced per wafer may be increased to improve productivity. In order to reduce the whole area of the semiconductor memory apparatus, various methods have been suggested. One of these methods uses a vertical transistor having a vertical channel region instead of a conventional horizontal transistor having a horizontal channel region.

In the vertical transistor, a source and a drain are formed in the upper and the lower regions of pillars extended vertically, and a channel is formed between the source and the drain in up-and-down directions (vertically) along the pillars. The advantage of the vertical transistor is to manufacture one semiconductor cell in a narrower area than that of the horizontal transistor.

BRIEF SUMMARY OF THE INVENTION

Various embodiments of the invention are directed to provide a semiconductor device and a method for fabricating the same that comprises forming a bit line in pillars to increase a bit line process margin and reduce capacitance between the adjacent bit lines.

According to one aspect of an exemplary embodiment, a semiconductor device comprises: a first pillar and a second pillar each extended vertically from a semiconductor substrate and each including a vertical channel region; a first bit line located in the lower portion of the vertical channel region inside the first pillar and the second pillar; and an interlayer insulating film located between the first pillar and the second pillar that include the first bit line.

The first bit line includes a metal silicide and the metal silicide includes a cobalt silicide ($CoSi_2$).

The first bit line is disposed at both sides of the first pillar and the second pillar.

The semiconductor device further comprises a second bit line located at a sidewall of the first and second pillars in contact with the first bit line.

The second bit line includes a titanium nitride film (TiN), a tungsten (W) and a tungsten nitride film (WN) or has a stacked structure including at least two or more selected from a titanium nitride film (TiN), a tungsten (W) and a tungsten nitride film (WN).

The second bit line is disposed at both sides of the first pillar and the second pillar.

The semiconductor device further comprises: upper junction regions located in the upper portion of the vertical channel region in the first pillar and the second pillar; and a lower junction region located in the lower of the vertical channel region in the first pillar and the second pillar.

The first bit line is located inside the lower junction region.

The semiconductor device further comprises a wall oxide layer located on the surface of the first pillar and the second pillar. The wall oxide layer is located in the vertical channel region of the first pillar and the second pillar and the upper junction region.

The semiconductor device further comprises a spacer located on the left and right side surfaces of the first pillar and the second pillar. The spacer includes a nitride film.

The upper junction region and the lower junction region are an N-type and the vertical channel region is a P-type or the upper junction region and the lower junction region are a P-type and the vertical channel region is an N-type.

The semiconductor device further comprises a nitride film located in the upper portion of the first pillar and the second pillar.

The interlayer insulating film includes: a first interlayer insulating film; and a second interlayer insulating film located in the upper portion of the first interlayer insulating film.

The first pillar and the second pillar include a line pattern.

The semiconductor device further comprises a gate located in a region corresponding to the vertical channel region and extended in contact with the vertical channel region.

The semiconductor device further comprises a capacitor located in the upper portion of the first pillar and the second pillar and connected to the upper junction region.

According to one aspect of an exemplary embodiment, a method for fabricating a semiconductor device comprises: forming a first pillar and a second pillar over a semiconductor substrate; forming a first bit line inside the first pillar and the second pillar; and forming an interlayer insulating film between the first pillar and the second pillar that include the first bit line.

The forming-a-first-pillar-and-a-second-pillar includes: forming a pillar hard mask over the semiconductor substrate; and etching the semiconductor substrate with the pillar hard mask as a mask.

The forming-a-first-pillar-and-a-second-pillar includes growing a silicon epitaxially over the semiconductor substrate.

After forming the first pillar and the second pillar, the method further comprises performing an oxidation process on the surface of the first pillar and the second pillar to form a wall oxide layer.

Before forming the first bit line, the method further comprises forming a lower junction region in the lower of the first pillar and the second pillar.

The forming-a-lower-junction-region includes performing an ion-implanting process or a plasma doping process with phosphorus (Ph) or arsenic (As).

The forming-a-lower-junction-region includes: removing the wall oxide layer disposed over the semiconductor substrate; and etching the semiconductor substrate with a given depth.

The forming-a-first-bit-line includes: forming a first conductive layer over the whole surface of the first pillar and the second pillar; removing the first conductive layer disposed over the semiconductor substrate; and performing a rapid thermal annealing process.

The rapid thermal annealing process includes reacting a metal material of the first conductive layer with a silicon of the first pillar and the second pillar.

The removing-the-first-conductive-layer includes etching the semiconductor substrate with a given depth.

The first conductive layer includes a cobalt (Co).

After removing the first conductive layer disposed over the semiconductor substrate, the method further comprises performing a slant etch process on the first pillar and the second pillar to etch the first conductive layer formed on one side surface of the first pillar and the second pillar.

After forming the first bit line, the method further comprises forming a second bit line on the side surface of the first pillar and the second pillar in contact with the first bit line.

The forming-a-second-bit-line includes: forming a second conductive layer over the whole surface of the first pillar and the second pillar where the first bit line is formed; removing the second conductive layer disposed over the semiconductor substrate; forming a first interlayer insulating film with a given height between the first pillar and the second pillar; and removing the second conductive layer disposed over the first interlayer insulating film.

The forming-a-first-interlayer-insulating-film-with-a-given-height includes: planarizing the first interlayer insulating film disposed over the whole surface of the first pillar and the second pillar; and performing an etch-back process on the first interlayer insulating film.

The surface of the first interlayer insulating film has the same or higher height than that of the upper end of the first bit line.

After forming the first bit line, the method further comprises forming a spacer including a nitride film at the sidewall of the first pillar and the second pillar.

The method further comprises: performing a channel ion-implanting process on the first pillar and the second pillar to form a vertical channel region; and performing an upper junction region ion-implanting process on the first pillar and the second pillar to form upper junction regions.

The method further comprises forming a gate in contact with the vertical channel region.

The method further comprises forming a capacitor in the upper portion of the first pillar and the second pillar.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Exemplary embodiments of the present invention will be described in detail with reference to the attached drawings.

Figure 12:
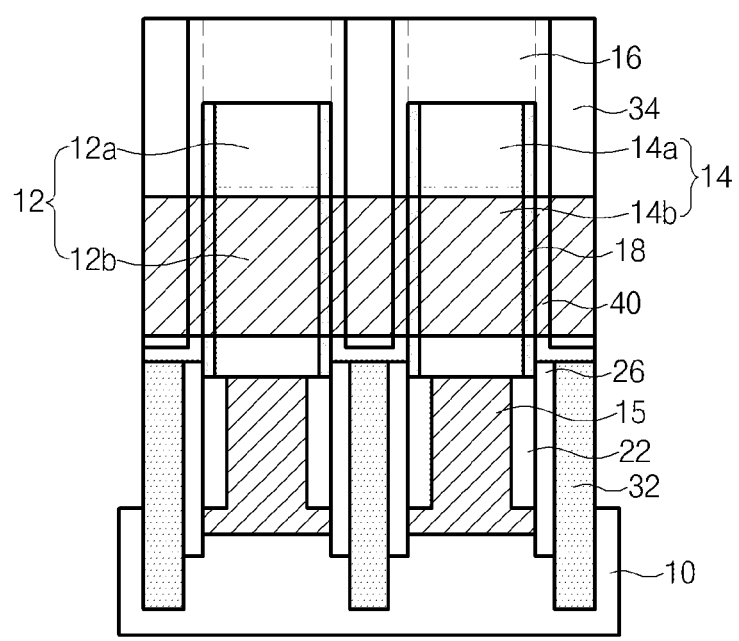

FIG. 12 is a cross-sectional diagram illustrating a semiconductor device according to an embodiment of the present invention.

Referring to FIG. 12, pillars 12 and 14 extend in a vertical direction from a semiconductor substrate 10. The two pillars 12 and 14, which are adjacent to each other, are designated as a first pillar 12 and a second pillar 14, respectively. Upper junction regions 12a and 14a are formed in the upper portion of the pillars 12 and 14, vertical channel regions 12b and 14b are formed in the middle portion of the pillars 12 and 14, and a lower junction region 15 is formed in the lower portion of the pillars 12 and 14. Thus, a channel of the transistor is formed along the vertical channel region 12b located between the upper junction region 12a and the lower junction region 15.

The lower junction region 15 may be formed as an N-type region or a P-type region. When the lower junction region 15 is formed as a N-type region, as shown in FIG. 12, the upper junction regions 12a and 14a are also formed as N-type regions and the vertical channel regions 12b and 14b are formed as P-type regions. On the other hand, when the lower junction region 15 is formed as a P-type, the upper junction regions 12a and 14a are formed as P-type regions and the vertical channel regions 12b and 14b are formed as N-type regions.

A first bit line 22 is disposed in a lower portion of the vertical channel region 12b or 14b of the pillar 12 or 14, preferably, inside the lower junction region 15. The first bit line 22 is not formed between the adjacent pillars 12 and 14, but is formed inside either one of or both of the two pillars 12 and 14. The first bit line 22 includes metal silicide, which may include cobalt silicide ($CoSi_2$). It is desirable to form the first bit line 22 at left and right sidewalls of the pillars 12 or 14 to reduce bit line resistance, but the first bit line 22 may be formed at only one sidewall of the pillar 12 or 14.

Outside the first bit line 22 of the pillars 12 and 14, a second bit line 26 may be formed to be in contact with the first bit line 22. The second bit line 26 includes metal material, which may include a titanium nitride film (TiN), a tungsten (W) film, a tungsten nitride film (WN) or have a stacked structure thereof (e.g., a stacked structure including a tungsten nitride film and a tungsten). It is desirable to form the second bit line 26 on the left and right sidewalls of the pillar 12 or 14 to reduce bit line resistance, but the second bit line 26 may be formed at only one sidewall of the pillar 12 or 14.

In the pillar 12 or 14, a wall oxide layer 18 is formed on the left and the right sidewall of the upper junction regions 12a and 14a and the vertical channel regions 12b and 14b, but not on the lower junction region 15. The wall oxide layer 18, which may have the same structure as that of a gate insulating film, is formed to protect the surface of the pillars 12 and 14 including silicon material, and may be obtained by performing a Chemical Vapor Deposition (CVD) process on High-K materials such as SiO, ONO, HfO$_2$x, ZrO or PZT materials or by heating the semiconductor substrate in a furnace. Also, the wall oxide film 18 may be obtained by depositing High-K materials such as Zr or Hf on the surface of the pillars 12 and 14 by an Atomic Layer Deposition (ALD) process to be subject to natural oxidation.

On the left and the right sidewalls of the pillar 12 or 14 where the wall oxide layer 18 is formed, a spacer 40 is formed along an outer surface of the wall oxide layer 18. Also, the spacer 40 is formed to protect the surface of the pillars 12 and 14 and may include a nitride film with a low etch selectivity.

In a semiconductor device according to an embodiment of the present invention, since the bit line 22 is not formed between the pillars 12 and 14, but is formed inside the pillars 12 and 14, it is possible to secure a broad space between the adjacent bit lines 22, thereby improving a process margin of the bit line 22 and reducing parasitic capacitance generated between the adjacent bit lines 22.

To further explain the advantages of the present invention, as illustrated by the embodiments described above, features of the present invention will be discussed further. According to an embodiment of the present invention, a first pillar 12 is formed to extend from a semiconductor substrate. First bit lines 22 are formed on at least two sidewalls of the first pillar 12. The first bit lines 22 include metal silicide films, respectively. The first bit lines 22 are formed at first and second sidewalls. The first sidewall may be opposite to the second sidewall. The first bit lines 22 are formed by a rapid thermal annealing process.

A lower junction region 15 is formed at a lower portion of the first pillar 12. The first bit lines 22 are coupled to the lower junction region 15.

Second bit lines 26 may be formed over the first bit lines 22, respectively. The second bit lines 26 are coupled to the first bit lines 22, respectively. The second bit lines may include a titanium nitride film (TiN), a tungsten (W) film, a tungsten nitride film (WN), or a combination thereof.

A gate (the upper hatching region in FIG. 12) may be formed over a third sidewall of the first pillar 12. The gate is coupled to the first bit lines 22. An upper junction region 12a is formed at an upper portion of the first pillar 12. The gate is coupled to the vertical channel region 12b.

In another embodiment of the present invention, a first pillar 12 is formed over a semiconductor substrate. At least two sidewalls of the first pillar 12 are transformed into conductive films to form first bit lines 22. The conductive films may be metal silicide films.

The step of transforming the sidewalls of the first pillar 12 into conductive films may include (i) forming metal layers 24 over the two sidewalls of the first pillar 12, and (ii) performing a rapid thermal annealing process on the metal layers 24 to transform the two sidewalls of the first pillar 12 into the conductive films. Second bit lines 26 are formed over the first bit lines 22, respectively, and are coupled to the first bit lines 22.

The first pillar 12 has a lower junction region 12b, and the first bit lines 22 are coupled to the lower junction region 12b.

FIGS. 1-12 are cross-sectional diagrams illustrating a method for fabricating a semiconductor device according to an embodiment of the present invention.

Hereinafter, a method for forming a semiconductor device according to an embodiment of the present invention will be described in more detail with reference to FIGS. 1-12.

Figure 1:
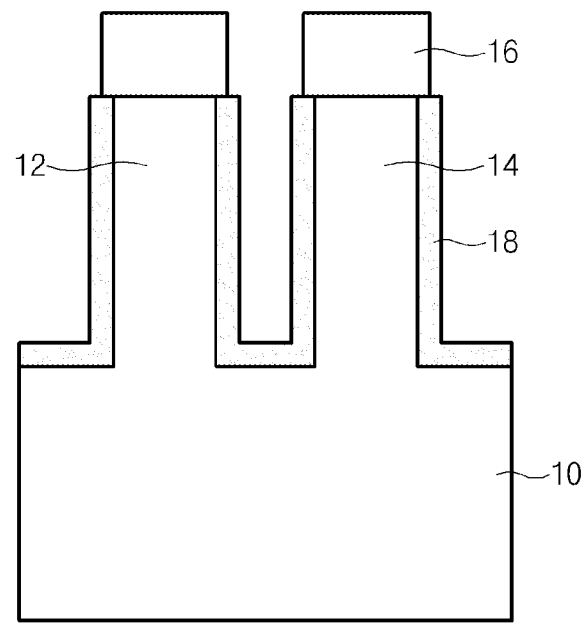
FIGS. 1-12 are cross-sectional diagrams illustrating a method for fabricating a semiconductor device according to an embodiment of the present invention.

Referring to FIG. 1, a semiconductor substrate 10 is patterned to form the first pillar 12 and the second pillar 14. Although FIG. 1 shows a cross-sectional view, these pillars 12 and 14 may be formed with a line pattern extending along front and rear directions (forwards and backwards) or may be formed with a structure extending vertically with a pillar shape from the semiconductor substrate 10.

There are various methods for forming the pillars 12 and 14. As shown in FIG. 1, in an embodiment, a pillar hard mask 16 is formed over the semiconductor substrate 10 and the semiconductor substrate 10 is etched using the pillar hard mask 16 as a mask to obtain the pillars 12 and 14. For the hard mask 16, various materials such as a photoresist film, an oxide film, a nitride film, a silicon oxide nitride film, or an amorphous carbon layer may be used with a different etch selectivity from the semiconductor substrate 10 including a silicon (Si) material. Although it is not shown, in an embodiment, a selective epitaxial growth process of the silicon over the semiconductor substrate 10 may be used to obtain the pillars 12 and 14. After the pillars 12 and 14 are formed, an oxidation process is performed on the pillars 12 and 14 to form the wall oxide layer 18 on the surface of the pillars 12 and 14.

Figure 2:
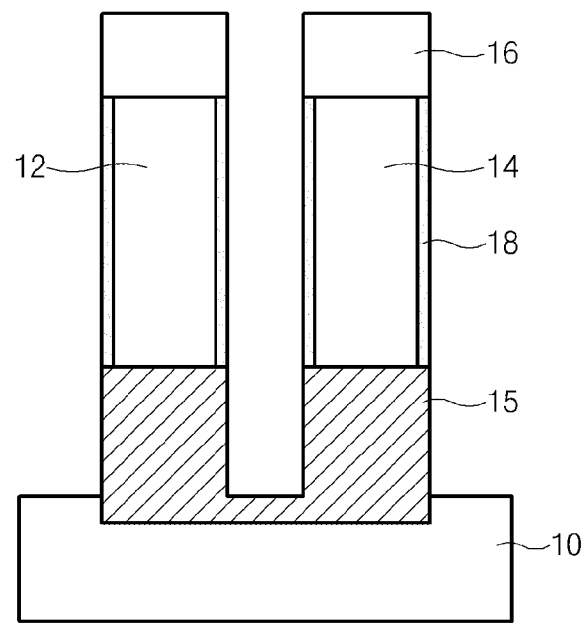

As shown in FIG. 2, an anisotropic etch process or a spacer etch process is performed to remove the wall oxide layer 18 disposed over the semiconductor substrate 10 while maintaining the oxide layer 18 disposed over the sidewalls of the pillars 12 and 14. Also, by the anisotropic etch process, the semiconductor substrate 10 is further etched to a given depth to expose a part of the semiconductor substrate 10, which includes silicon Si. The heights of the pillars 12 and 14 can be adjusted so that the lower portion of the pillars 12 and 14 that do not include the wall oxide layer 18 can be further formed later.

The lower junction region 15 is formed in a lower portion of the pillars 12 and 14. There are various methods for forming the lower junction region 15. For example, an ion-implanting process or a plasma doping process may be used. The plasma doping process may be performed with phosphorus (Ph) or arsenic (As). Meanwhile, as mentioned above, the lower junction region 15 may be formed as an N-type or P-type.

Figure 3:
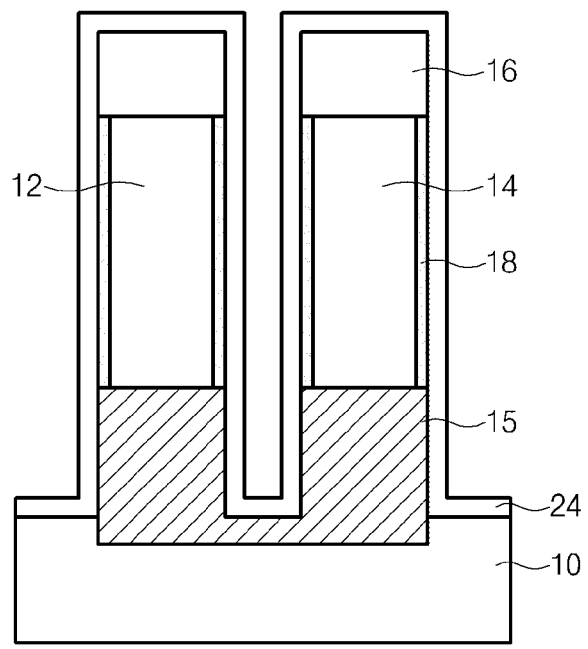

Referring to FIG. 3, a first conductive layer 24 is formed over the whole surface of the pillars 12 and 14, including the lower junction region 15. The first conductive layer 24 includes a metal material. Specifically, in an embodiment, the first conductive layer 24 may include cobalt (Co). The first conductive layer 24 is uniformly formed over the whole surface including the sidewalls of the pillars 12 and 14 and may be deposited by a Chemical Vapor Deposition (CVD) process or an Atomic Layer Deposition (ALD) process.

Figure 4:
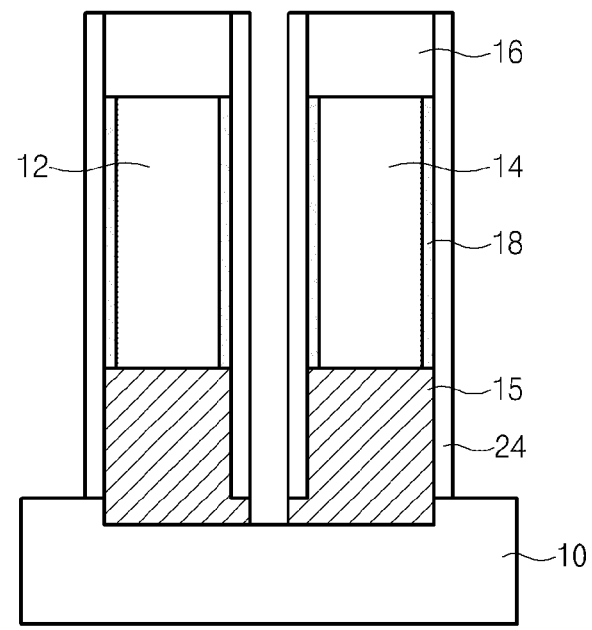

As shown in FIG. 4, an anisotropic etch (or spacer etch) process is performed to remove the first conductive layer 24 formed over the semiconductor substrate 10. Although the first conductive layer 24 disposed over top surfaces of the pillars 12 and 14 may be removed together, the first conductive layer 24 disposed at the sidewalls of the pillars 12 and 14 remains. During this process, the lower junction region 15 is separated into two. In addition, while the semiconductor substrate 10 disposed between the two pillars 12 and 14 is etched to a given depth, the lower junction region 15 over the semiconductor substrate is removed while the lower junction region 15 disposed in the lower portions of the pillars 12 and 14 remains.

Figure 5:
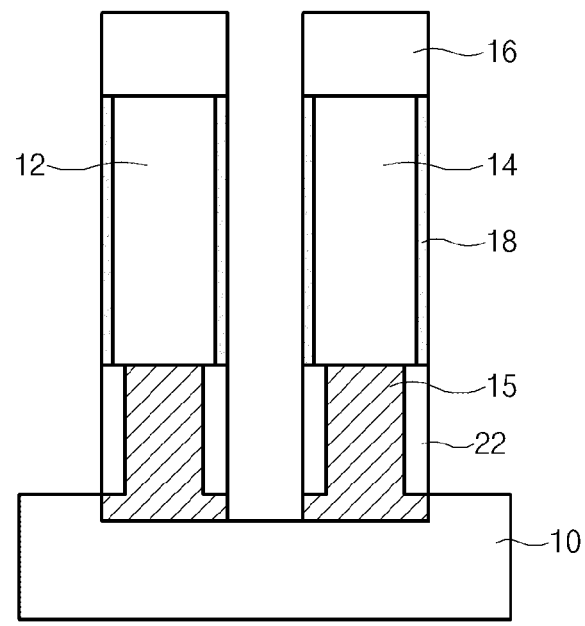

Referring to FIG. 5, a Rapid Thermal Annealing (RTA) process is performed to form the first bit line 22 inside the pillars 12 and 14. If the RTA process is performed, the metal material of the first conductive layer 24 reacts with the silicon Si of the pillars 12 and 14 to form a metal silicide inside the pillars 12 and 14. If the metal material is cobalt (Co), the metal silicide formed is cobalt silicide ($CoSi_2$). The metal silicide operates as a bit line in the semiconductor device, and is designated as the first bit line 22. After the RTA process, the first conductive layer 24 that remains at the sidewalls of the pillars 12 and 14. That is, the first conductive layer 24 that has not reacted with the silicon (without forming a silicide) due to the wall oxide layer 18, is removed by a cleaning process.

Although the first bit line 22 is formed on the left and the right sidewalls of the pillars 12 and 14 as shown in FIG. 5, it may be formed on only one sidewall of the pillars 12 and 14. In this case, it is necessary to form the first conductive layer 24 only on one sidewall of the pillars 12 and 14. For example, in FIG. 4, a slant etch process is performed to remove the first conductive layer 24 formed on one sidewall (left side surface or right side surface) of the pillars 12 and 14. Thereafter, the RTA process shown in FIG. 4 is performed to form the first bit line 22 on only one sidewall of the pillars 12 and 14.

Figure 6:
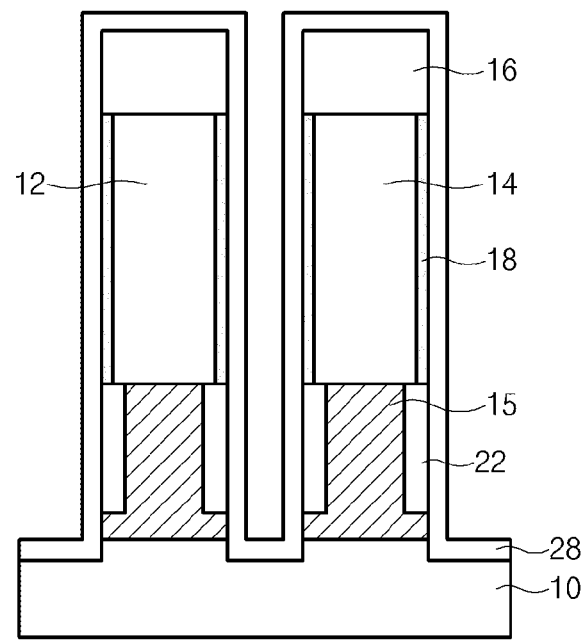

As shown in FIG. 6, a second conductive layer 28 is formed over the whole surface of the pillars 12 and 14 including the first bit line 22. The second conductive layer 28 also includes a conductive material, such as metal, and may include a titanium nitride film (TiN), a tungsten (W) film, a tungsten nitride film (WN), or a stacked structure including at least two or more among a titanium nitride film (TiN), a tungsten (W) and a tungsten nitride film (WN). The second conductive layer 28 is uniformly formed over the whole surface including the sidewalls of the pillars 12 and 14 and may be deposited by a Chemical Vapor Deposition (CVD) process or an Atomic Layer Deposition (ALD) process.

Figure 7:
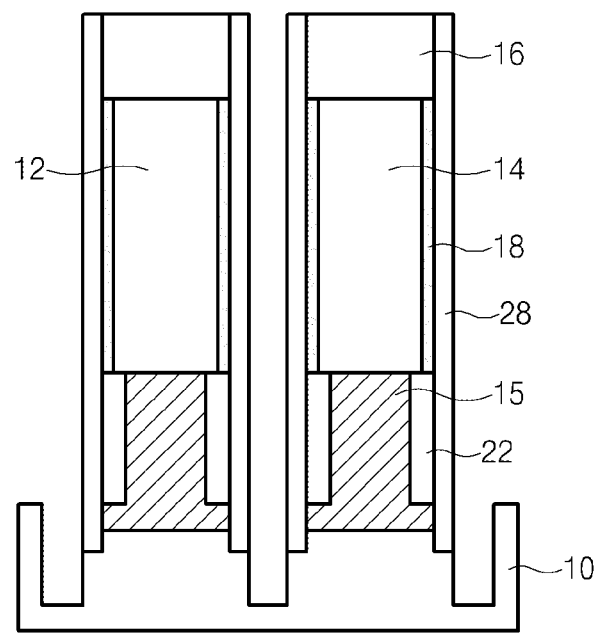

Referring to FIG. 7, an anisotropic etch (spacer etch) process is performed to remove the second conductive layer 28 formed over the semiconductor substrate 10. The semiconductor substrate 10 may also be etched to a given depth so that the heights of the pillars 12 and 14 may also be relatively higher. As a result, the second conductive layer 28 disposed on the surface of the two adjacent pillars 12 and 14 may be electrically isolated from each other.

Figure 8:
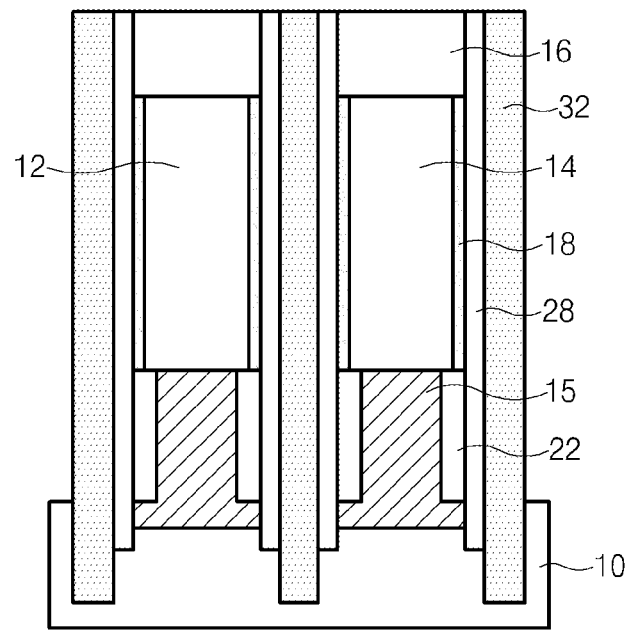

As shown in FIG. 8, a first interlayer insulating film 32 is deposited over the semiconductor substrate and fills in a space between the pillars 12 and 14. The first interlayer insulating film 32 is then planarized. The second conductive layers 28 formed at the sidewalls of the adjacent pillars 12 and 14 are thus insulated from each other. The first interlayer insulating film 32 may include $SiO_2$, Boron Phosphorus Silicate Glass (BPSG), Phosphorus Silicate Glass (PSG), Tetra Ethyl Ortho Silicate (TEOS), Un-doped Silicate Glass (USG), Spin On Glass (SOG), High Density Plasma (HDP), Spin On Dielectric (SOD), Plasma Enhanced Tetra Ethyl Ortho Silicate (PE-TEOS), or Silicon Rich Oxide (SROx).

Figure 9:
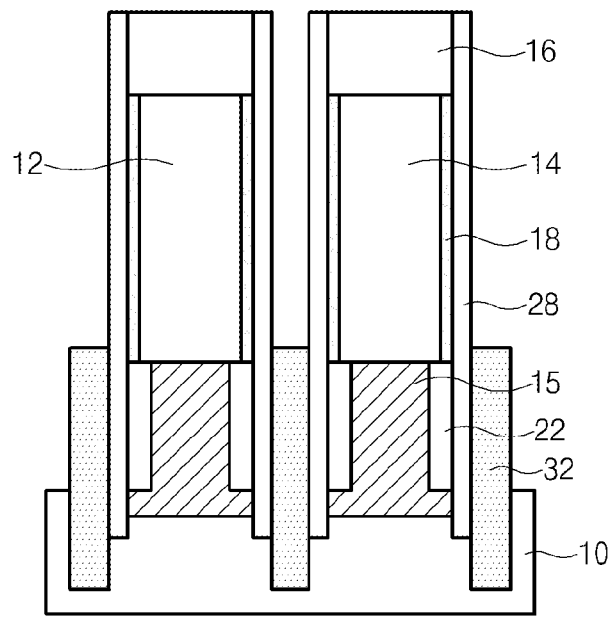

Referring to FIG. 9, the first interlayer insulating film 32 is partially removed. A top surface of the remaining first interlayer insulating film 32 is level to or higher than an upper end of the first bit line 22 or an upper end of the lower junction region 15.

Figure 10:
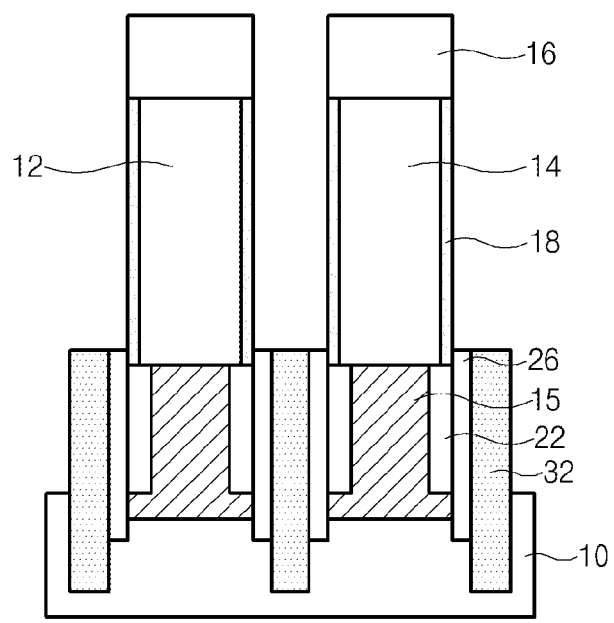

As shown in FIG. 10, a portion of the second conductive layer 28 that remains over the sidewalls of the pillars 12 and 14 is removed by a cleaning process. As a result, the second conductive layer 28 that remains is as high as the first interlayer insulating film 32. The remaining second conductive layer 28 becomes the second bit line 26. Although the second bit line 26 is not located inside but outside of the pillars 12 and 14, the second bit line 26 is in contact with the first bit line 22 to reduce resistance of the whole bit lines 22 and 26.

However, the process for forming the second bit line 26 shown in FIGS. 6-10 is optional in an embodiment of the present invention. That is, the operation of the semiconductor device according to an embodiment of the present invention may be performed with only the first bit line 22 formed inside the pillars 12 and 14. The second bit line 26 can be additionally formed outside the first bit line in order to further reduce resistance of the first bit line 22.

Figure 11:
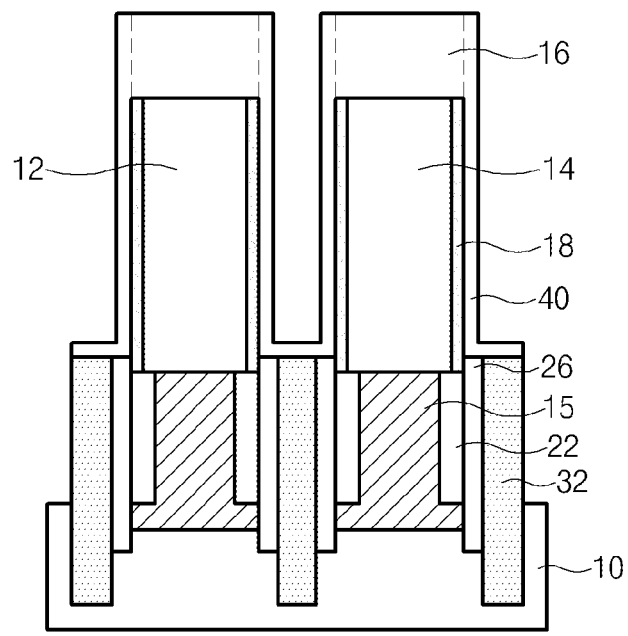

Referring to FIG. 11, a spacer material is deposited over the whole surface of the pillars 12 and 14 where the second conductive layer has been 28 removed. An etch-back process is performed to form a spacer 40 only at the sidewalls of the pillars 12 and 14. For this spacer material, a nitride film may be used. The spacer 40 serves as a protector to protect the surface of the pillars 12 and 14 along with the pillar hard mask 16.

As shown in FIG. 12, a second interlayer insulating film 34 is formed over the whole surface of the pillars 12 and 14 and the spacer 40 to level the whole structure including the pillars 12 and 14.

Although it is not shown in the drawing, a channel ion-implanting and an upper junction region ion-implanting process are performed on the pillars 12 and 14 to form a gate (the upper hatching region) in contact with the vertical channel regions 12b and 14b in the corresponding region to the vertical channel regions 12b and 14b. In a plan view, the gate is extended in a vertical direction to the bit lines 22 and 26 and may be formed to surround the pillars 12 and 14 or the gate may be formed as a double gate in contact with both sidewalls of the pillar 12 or 14. Thereafter, the pillar hard mask 16 disposed over the pillar 12 or 14 is removed to form a capacitor connected with the upper junction regions 12a and 14a.

The above-described method for fabricating a semiconductor device according to an embodiment of the present invention may easily form the bit line 22 inside the pillar 12 or 14 and secure a broad space between neighboring bit lines 22 coupled to the adjacent pillars 12 and 14, respectively. Thus, the process margin can increase and parasitic capacitance between neighboring bit lines 22 can be reduced.

The memory device according to an embodiment of the present invention may be applied to dynamic random access memories (DRAMs), but it is not limited thereto and it may be applied to static random access memories (SRAMs), flash memories, ferroelectric random access memories (FeRAMs), magnetic random access memories (MRAMs), or phase change random access memories (PRAMs).

The above-described memory device according to an embodiment of the present invention can be used, for example, in desktop computers, portable computers, computing memories used in servers, graphics memories having various specs, and mobile electronic devices as technology continues to evolve. Further, the above-described semiconductor device may be provided to various digital applications such as mobile recording mediums including a memory stick, multimedia card (MMC), secure digital (SD), compact flash (CF), extreme digital (xD) picture card, and a universal serial bus (USB) flash device as well as various applications such as MP3P, portable multimedia player (PMP), a digital camera, a camcorder, and a mobile phone. A semiconductor device may be applied to a technology such as multi-chip package (MCP), disk on chip (DOC), or embedded device. The semiconductor device may be applied to a CMOS image sensor to be provided to various fields such as a camera phone, a web camera, and a small-size image capture device for medicine.

As described above, a semiconductor device and a method for fabricating the same according to an embodiment of the present invention may enable the bit line to be formed easily, increase the bit line process margin and reduce capacitance between the adjacent bit lines.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
    a first pillar and a second pillar each including a vertical channel region;
    a first bit line located inside a lower portion of any of the first pillar and the second pillar;
    a second bit line located outside any of the first and second pillars, and being in contact with the first bit line; and
    an interlayer insulating film located between the first pillar and the second pillar,
    wherein the first and second pillars are protruding regions of a semiconductor substrate.

2. The semiconductor device according to claim 1, wherein the first bit line includes a metal silicide.

3. The semiconductor device according to claim 2, wherein the metal silicide includes a cobalt silicide ($CoSi_2$).

4. The semiconductor device according to claim 1, wherein the first bit line is disposed at a first sidewall and a second sidewall of any of the first pillar and the second pillar.

5. The semiconductor device according to claim 1, wherein the second bit line includes a titanium nitride film (TiN), a tungsten (W) film, a tungsten nitride film (WN) or a combination thereof.

6. The semiconductor device according to claim 1, wherein the second bit line is disposed outside a first sidewall and a second sidewall of any of the first pillar and the second pillar.

7. The semiconductor device according to claim 1, the device further comprising:
    an upper junction region located in an upper portion of any of the first pillar and the second pillar; and
    a lower junction region located below the vertical channel region of any of the first pillar and the second pillar.

8. The semiconductor device according to claim 7, wherein the first bit line is located inside the lower junction region.

9. The semiconductor device according to claim 1, the device further comprising a wall oxide layer located over a surface of any of the first pillar and the second pillar.

10. The semiconductor device according to claim 9, wherein the wall oxide layer is located over a surface of a sidewall of the vertical channel region of any of the first pillar and the second pillar and extends over a surface of a sidewall of the upper junction region.

11. The semiconductor device according to claim 1, the device further comprising a spacer located over a sidewall of any of the first pillar and the second pillar.

12. The semiconductor device according to claim 11, wherein the spacer includes a nitride film.

13. The semiconductor device according to claim 7, wherein the upper junction region and the lower junction region are N-type regions and the vertical channel region is a P-type region.

14. The semiconductor device according to claim 7, wherein the upper junction region and the lower junction region are P-type regions and the vertical channel region is an N-type region.

15. The semiconductor device according to claim 1, the device further comprising a nitride film located over any of the upper portion of the first pillar and the second pillar.

16. The semiconductor device according to claim 1, wherein the interlayer insulating film includes:
    a first interlayer insulating film; and
    a second interlayer insulating film located over an upper portion of the first interlayer insulating film.

17. The semiconductor device according to claim 1, wherein the first pillar and the second pillar include line patterns, respectively.

18. The semiconductor device according to claim 1, the device further comprising a gate located in a region corresponding to the vertical channel region and in contact with the vertical channel region.

19. The semiconductor device according to claim 7, the device further comprising a capacitor coupled to the upper junction region of any of the first pillar and the second pillar.

20. The semiconductor device according to claim 1, wherein the interlayer insulating film contacts an outer sidewall of the second bit line.

* * * * *